(12) United States Patent
Stoschus et al.

(10) Patent No.: US 11,209,737 B1
(45) Date of Patent: Dec. 28, 2021

(54) PERFORMANCE OPTIMIZED SCANNING SEQUENCE FOR EBEAM METROLOGY AND INSPECTION

(71) Applicant: KLA Corporation, Milpitas, CA (US)

(72) Inventors: Henning Stoschus, Wetzlar (DE); Stefan Eyring, Weilburg (DE); Ulrich Pohlmann, Jena (DE); Inna Steely-Tarshish, Yokneam Ilit (IL); Nadav Gutman, Zichron Ya'aqov (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/916,272

(22) Filed: Jun. 30, 2020

(51) Int. Cl.
*G03F 7/20* (2006.01)
*G06K 9/32* (2006.01)
*G06T 7/00* (2017.01)

(52) U.S. Cl.
CPC ...... *G03F 7/70133* (2013.01); *G03F 7/70358* (2013.01); *G06K 9/3233* (2013.01); *G06T 7/0004* (2013.01); *G06T 2207/30148* (2013.01); *G06T 2207/30168* (2013.01)

(58) Field of Classification Search
CPC ............. G03F 7/70133; G03F 7/70358; G03F 7/70625; G03F 7/70633; G06T 7/70004
USPC .............................. 355/52, 53, 55; 356/237.2
See application file for complete search history.

(56) References Cited

U.S. PATENT DOCUMENTS

| | | | |
|---|---|---|---|
| 6,587,744 B1 | 7/2003 | Stoddard et al. | |
| 7,541,201 B2 | 6/2009 | Ghinovker | |
| 8,330,281 B2 | 12/2012 | Ghinovker et al. | |
| 9,036,895 B2 * | 5/2015 | Sohn | G06T 7/0004 382/145 |
| 9,214,317 B2 | 12/2015 | Shur | |
| 9,476,698 B2 | 10/2016 | Abdulhalim et al. | |
| 9,704,238 B2 | 7/2017 | Eyring et al. | |
| 10,692,227 B2 * | 6/2020 | Riggs | G06T 7/337 |
| 10,831,110 B2 * | 11/2020 | Hung | G03F 7/70633 |
| 2007/0237383 A1 | 10/2007 | Funk et al. | |
| 2013/0035888 A1 | 2/2013 | Kandel et al. | |
| 2014/0169861 A1 | 6/2014 | Apfel | |

(Continued)

FOREIGN PATENT DOCUMENTS

| | | |
|---|---|---|
| WO | 2018004511 A1 | 1/2018 |
| WO | PCTUS2016029531 | 1/2018 |
| WO | 2019239380 A1 | 12/2019 |

OTHER PUBLICATIONS

PCT International Search Report and Written Opinion for International Application No. PCT/US2021/038787 dated Oct. 13, 2021, 6 pages.

*Primary Examiner* — Hung Nguyen
*Assistant Examiner* — Hung Henry Nguyen
(74) *Attorney, Agent, or Firm* — Suiter Swantz pc llo

(57) ABSTRACT

A metrology system may include a characterization tool configured to generate metrology data for a sample based on the interaction of an illumination beam with the sample, and may also include one or more adjustable measurement parameters to control the generation of metrology data. The metrology system may include one or more processors that may receive design data associated with a plurality of regions of interest for measurement, select individualized measurement parameters of the characterization tool for the plurality of regions of interest, and direct the characterization tool to characterize the plurality of regions of interest based on the individualized measurement parameters.

24 Claims, 4 Drawing Sheets

(56) References Cited

U.S. PATENT DOCUMENTS

2014/0199791 A1 7/2014 Park et al.
2016/0290796 A1 10/2016 Levy et al.
2019/0025705 A1* 1/2019 Van Der Laan .... G03F 7/70616

* cited by examiner

PERFORMANCE OPTIMIZED SCANNING SEQUENCE FOR EBEAM METROLOGY AND INSPECTION

TECHNICAL FIELD

The present disclosure relates generally to overlay metrology and, more particularly, to overlay metrology using individualized measurement parameters.

BACKGROUND

Semiconductor fabrication typically requires fabricating multiple layers on a structure in which some or all of the layers include patterned features. Overlay metrology is the measurement of the relative positions of structures on various layers of a sample, which are critical to the performance of a fabricated device and must typically be controlled within tight tolerances. For example, overlay metrology may measure the relative positions of features on different sample layers as a measure of the layer-by-layer alignment of fabrication tools.

Existing systems, such as optical illumination systems and electron beam systems, involve the use of optical or quasi-optical sensors that rely on pre-set measurement parameters across an entire field of view. However, samples typically include a variety of features, which are not of interest for the measurement. In addition, differences in size, density, orientation, and/or location of features may introduce a mismatch between measured overlay at the target and actual overlay of device features and may introduce inaccuracy to the measurement.

Accordingly, it would be desirable to apply individualized measurement parameters to one or more individual features within the field of view in order to optimize the measurement time and accuracy.

SUMMARY

A system is disclosed in accordance with one or more embodiments of the present disclosure. In one embodiment, the system includes a characterization tool configured to generate metrology data for a sample based on interaction of an illumination beam with the same, wherein the characterization tool includes one or more adjustable measurement parameters to control the generation of metrology data. In another embodiment, the metrology system includes a controller communicatively coupled to the characterization tool. In another embodiment, the controller includes one or more processors configured to execute program instructions causing the one or more processors to: receive design data associated with a plurality of regions of interest for measurement with the characterization tool, wherein the design data of a particular region of interest of the plurality of regions of interest includes at least locations of edges in the particular region of interest; select individualized measurement parameters of the characterization tool for the plurality of regions of interest based on the design data to provide metrology data from a detector satisfying a selected quality metric; and direct the characterization tool to characterize the plurality of regions of interest based on the individualized measurement parameters.

A system is disclosed in accordance with one or more embodiments of the present disclosure. In one embodiment, the metrology system includes a characterization tool comprising an illumination source configured to generate an illumination beam, one or more illumination optics to direct the illumination beam to a sample, and a detector to generate metrology data for the sample based on interaction of the illumination beam with the sample, wherein the characterization tool includes one or more adjustable measurement parameters to control the generation of metrology data. In another embodiment, the metrology system includes a controller communicatively coupled to the characterization tool. In another embodiment, the controller includes one or more processors configured to execute program instructions causing the one or more processors to: receive design data associated with a plurality of regions of interest for measurement with the characterization tool, wherein the design data of a particular region of interest of the plurality of regions of interest includes at least locations of edges in the particular region of interest; select individualized measurement parameters of the characterization tool for the plurality of regions of interest based on the design data to provide metrology data from the detector satisfying a selected quality metric; and direct the characterization tool to characterize the plurality of regions of interest based on the individualized measurement parameters.

A method is disclosed, in accordance with one or more embodiments of the present disclosure. In one embodiment, the method includes receiving design data associated with a plurality of regions of interest for measurement with a characterization tool configured to generate metrology data for a sample based on interaction of an illumination beam with a sample, wherein the characterization tool includes one or more adjustable measurement parameters to control the generation of metrology data, wherein the design data of a particular region of interest of the plurality of regions of interest includes at least locations of edges in the particular region of interest. In another embodiment, the method includes selecting individualized measurement parameters of the characterization tool for the plurality of regions of interest based on the design data to provide metrology data from the detector satisfying a selected quality metric. In another embodiment, the method includes directing the characterization tool to characterize the plurality of regions of interest based on the individualized measurement parameters.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
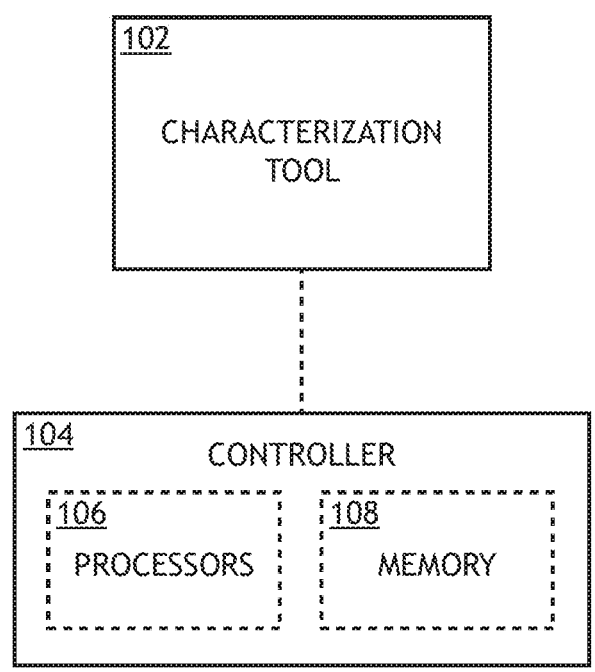
FIG. 1A is a conceptual view of a metrology system suitable for the application of individualized measurement parameters for overlay targets, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for metrology. For example, a target may include one or more features (e.g., size, shape, orientation, density, edges, etc.), which features may be located on multiple layers or may be formed from different materials. Simultaneous measurement of multiple features may be impractical or difficult as a result of the different characteristics of the different features and types of materials from which the target may be formed.

It is recognized herein that a semiconductor device may by formed as multiple printed layers of patterned material on a substrate. Each printed layer may be fabricated through a series of process steps such as, but not limited to, one or more material deposition steps, one or more lithography steps, or one or more etching steps. Further, each printed layer must be fabricated within specific tolerances to properly construct the final device. For example, printing characteristics such as, but not limited to, the linewidths, sidewall angles, and relative placement of printed elements in each layer must be well characterized and controlled. Accordingly, metrology targets may be fabricated on one or more printed layers and using different processes. In this regard, metrology targets may include multiple materials for which a metrology system may require separate measurement parameters in order to obtain an accurate and/or desirable measurement.

It is recognized herein that various characterization tools may be used to measure overlay. For example, the characterization tools may include a metrology tool (e.g., image-based overlay metrology tool), an inspection tool, and/or a review tool. By way of another example, the characterization tools may include optical metrology tools (e.g., light-based metrology tools using electromagnetic radiation for illumination and/or detection) that may provide high-throughput overlay measurements using numerous techniques such as, but not limited to, determining relative positions of spatially-separated features on multiple layers in an image, directly measuring pattern placement errors (PPE) on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. By way of another example, the characterization tools may include particle-based metrology tools such as, but not limited to, a scanning electron microscope (SEM) metrology tool (e.g., a critical dimension SEM (CD-SEM), or the like), or a focused ion beam (FIB) metrology tool may resolve metrology target features. Particle-beam metrology tools may have a limited ability to simultaneously measure features on multiple sample layers based on the particle penetration depth. For example, low-energy particle beams may be used to characterize a top layer (e.g., a current layer), while relatively higher-energy particle beams may penetrate deeper into the sample to characterize features on previously-fabricated layers. However, many particle-based metrology tools may have relatively lower throughput than optical metrology tools and may potentially induce damage to one or more layers during measurement. Systems and methods for overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2014/0169861 titled "APPARATUS AND METHOD FOR DETECTING OVERLAY ERRORS USING SCATTEROMETRY" and published on Sep. 2, 2004, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

Embodiments of the present disclosure are directed to systems and methods for measuring overlay involving the application of individualized measurement parameters for overlay targets. As previously described, an overlay target may include one or more layers and features. In this regard, metrology of an overlay target may require a plurality of measurements, where the each of the plurality of measurements is conducted using a different set of parameters.

FIG. 1A is a conceptual view of a metrology system 100 suitable for measuring overlay involving the application of individualized measurement parameters, in accordance with one or more embodiments of the present disclosure. The metrology system 100 includes at least one characterization tool 102 configured to generate metrology data for a sample based on interaction of an illumination beam with the sample. The characterization tool 102 may be configured to generate one-dimensional, two-dimensional, and three-dimensional metrology data (e.g., via one or more one-dimensional, two-dimensional, or three-dimensional sensors). For example, the metrology data may include any data generated from the interaction of the illumination beam with the sample, including, without limitation, an image of the sample or one or more regions of interest of the sample (e.g., areas of the sample with meaningful information to be measured). By way of another example, the metrology data may include a profile of one or more portions of the sample, such as a one-dimensional profile along a defined trace. By way of another example, the metrology data may include a two-dimensional profile representing the topographic properties (e.g., arrangement of physical features) of the sample. By way of another example, the metrology data may include a three-dimensional profile representing the inner and outer structure of the sample.

The characterization tool 102 may include one or more measurement parameters to control the generation of metrology data. For example, the one or more measurement parameters may include, but are not limited to, scan velocity, scan trajectory, number of averaged adjacent pixels associated with a datapoint of metrology data, integration time of one or more portions of a metrology system, shape of a feature or other measured area, and energy of the illumination beam. In the foregoing example, the energy of the illumination beam may correspond to at least one of a wavelength of the illumination beam, an intensity of the illumination beam, a particle energy, or a current density. The one or more measurement parameters may be adjusted automatically by the metrology system 100 (e.g., by one or more processors) or through user input.

In another embodiment, the metrology system 100 may include a controller 104. The controller 104 may include one or more processors 106 configured to execute program instructions maintained on a memory medium 108. In this regard, the one or more processors 106 of controller 104 may execute any of the various process steps described throughout the present disclosure. For example, the controller 104 may receive from the characterization tool 102 design data associated with a plurality of regions of interest for measurement with the characterization tool 102. Design data associated with a plurality of regions of interest for measurement with the characterization tool 102 may include, but is not limited to, data collected from a prior scan of the plurality of regions of interest, a-priori knowledge of the sample structure stored in the memory medium 108 or provided by user input, one or more modeled and/or simulated interactions of the illumination beam with one or more of the plurality of regions of interest, and machine-learning based algorithms executed by the controller 104. By way of another example, design data associated with a plurality of regions of interest may include, but is not limited to, data related to the position and/or relative position of at least one of the plurality of regions of interest (e.g., the location of one or more edges of at least one of the plurality of regions of interest).

In another embodiment, the controller 104 may select individualized measurement parameters of the characterization tool 102 for the plurality of regions of interest based on the design data to provide metrology data from the characterization tool 102. For example, the controller 104 may select individualized measurement parameters that will produce metrology data that is consistent with one or more quality metrics. The one or more quality metrics may include, but are not limited to, signal strength of the metrology data, signal to noise ratio of metrology data, contrast of an image of the sample generated by the characterization tool 102, and contrast to noise ratio of an image of the sample generated by the characterization tool 102. In another embodiment, the controller 104 may direct the characterization tool 102 to characterize the plurality of regions of interest based on the individualized measurement parameters. For example, the controller 104 may direct the characterization tool 102 to make one or more adjustments to one or more measurement parameters.

The metrology system 100 may be configured to select one or more individualized measurement parameters for one or more portions of the plurality of regions of interest. For example, the controller 104 may select an individualized measurement parameter for one portion of one of the plurality of regions of interest, and a different individualized measurement parameter for another portion of the same one of the plurality of regions of interest. By way of another example, the controller 104 may select one or more different individualized measurement parameters for one or more edges and/or boundaries of one or more of the plurality of regions of interest.

The metrology system 100 may be configured to select one or more individualized measurement parameters for one or more portions of the plurality of regions of interest such that the metrology data generated by the characterization tool 102 does not include metrology data for one or more uniform regions of the sample. For example, the controller 104 may select at least one of a faster scan velocity, a higher number of averaged adjacent pixels, a shorter integration time, or a more exclusive scan trajectory for the one or more uniform regions relative to the same individualized measurement parameters for the plurality of regions of interest.

The metrology system 100 may be configured to identify one or more of the plurality of regions of interest having common individualized measurement parameters. For example, the controller 104 may mask multiple regions of interest for which a common individualized measurement parameter will produce metrology data that is consistent with one or more quality metrics.

The one or more processors 106 of a controller 104 may include any processing element known in the art. In this sense, the one or more processors 106 may include any microprocessor-type device configured to execute algorithms and/or instructions. In one embodiment, the one or more processors 106 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 108. Further, the steps described throughout the present disclosure may be carried out by a single controller 104 or, alternatively, multiple controllers. Additionally, the controller 104 may include one or more controllers housed in a common housing or within multiple housings. In this way, any controller or combination of controllers may be separately packaged as a module suitable for integration into metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive, and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet, and the like). Therefore, the above description should not be interpreted as a limitation on the present invention but merely an illustration.

The characterization tool 102 may include any type of metrology tool (e.g., image-based overlay metrology tool), inspection tool, or review tool known in the art suitable for the purposes contemplated by the present disclosure. For example, the characterization tool 102 may illuminate a sample with an illumination beam and may further collect radiation emanating from the sample in response to the illumination beam. The illumination beam may include any type of illumination beam suitable for probing a sample such as, but not limited to, a light beam (e.g., photons), an electron beam, or an ion beam. Further, the radiation emanating from the sample may include photons, electrons, ions, neutral particles, or the like. Accordingly, the characterization tool 102 may include an optical metrology tool, an e-beam metrology tool, an ion-beam metrology tool, or the like.

The characterization tool 102 may further operate in either an imaging mode or a non-imaging mode. For example, the characterization tool 102 operating in an imaging mode may illuminate a portion of the sample larger than the system resolution and capture one or more images of the illuminated portion of the sample on a detector. The captured image may be any type of image known in the art such as, but not limited to, a brightfield image, a darkfield image, a phase-contrast image, or the like. Further, captured images may be stitched together (e.g., by the controller 104, or the like) to form a composite image of the sample. By way of another example, the characterization tool 102 may generate multiple images of the sample using multiple detectors either simultaneously or sequentially. For instance, the characterization tool 102 may generate images of the sample from different perspectives. In another instance, the characterization tool 102 may generate images of the sample using different beam energies (e.g., particle beam energies, optical intensities, wavelengths, or the like). By way of another example, the characterization tool 102 may scan a focused beam across the sample and capture radiation and/or particles emanating from the sample on one or more detectors at one or more measurement angles to generate the image. The focused beam may be scanned across the sample by modifying the beam path and/or by translating the sample through a focal volume of the focused beam. For instance, particle beams may be scanned using controlled electromagnetic fields (e.g., generated using one or more beam deflectors, or the like). In another instance, light beams may be scanned using scanning mirrors (e.g., galvo-mirrors, piezoelectric mirrors, or the like).

Figure 1B:
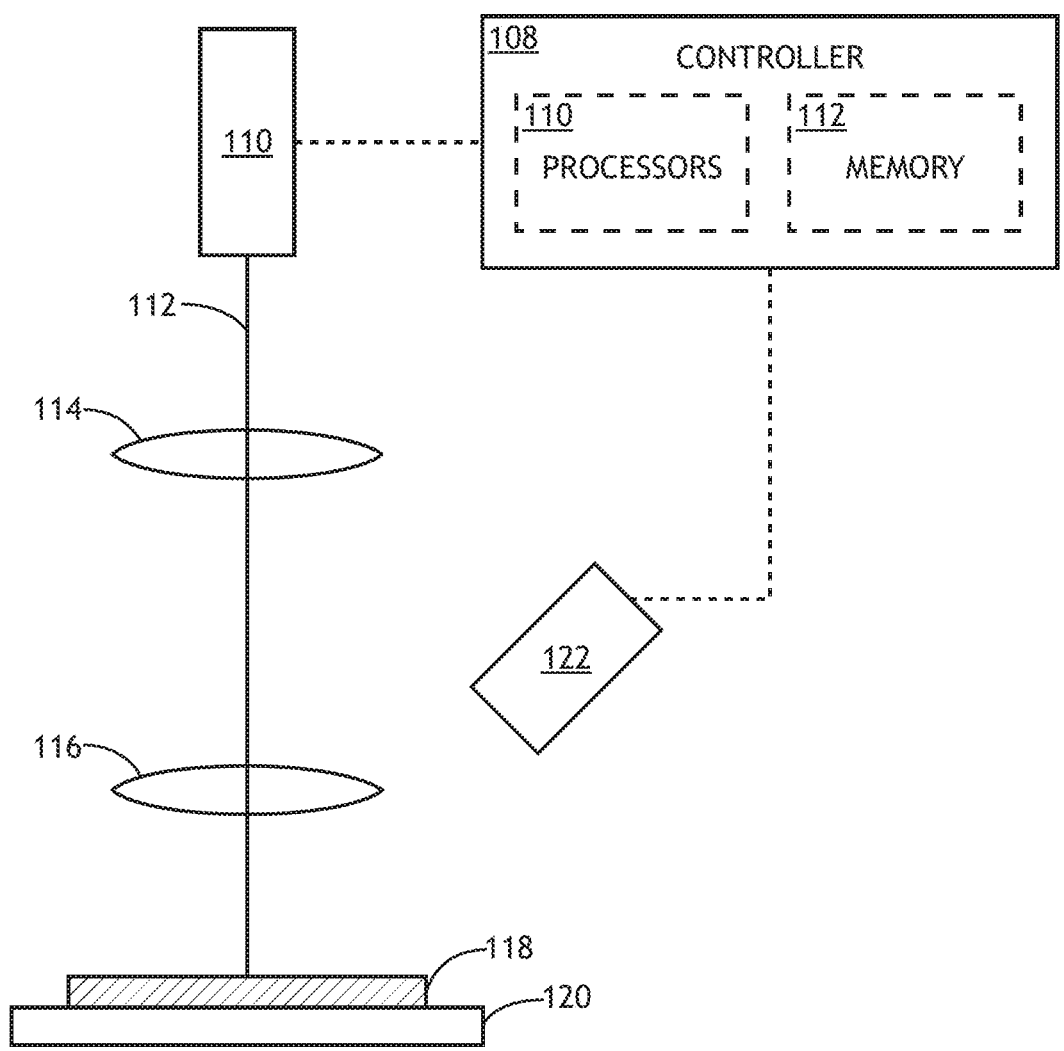
FIG. 1B is a conceptual view of a characterization tool, in accordance with one or more embodiments of the present disclosure.
Figure 1C:
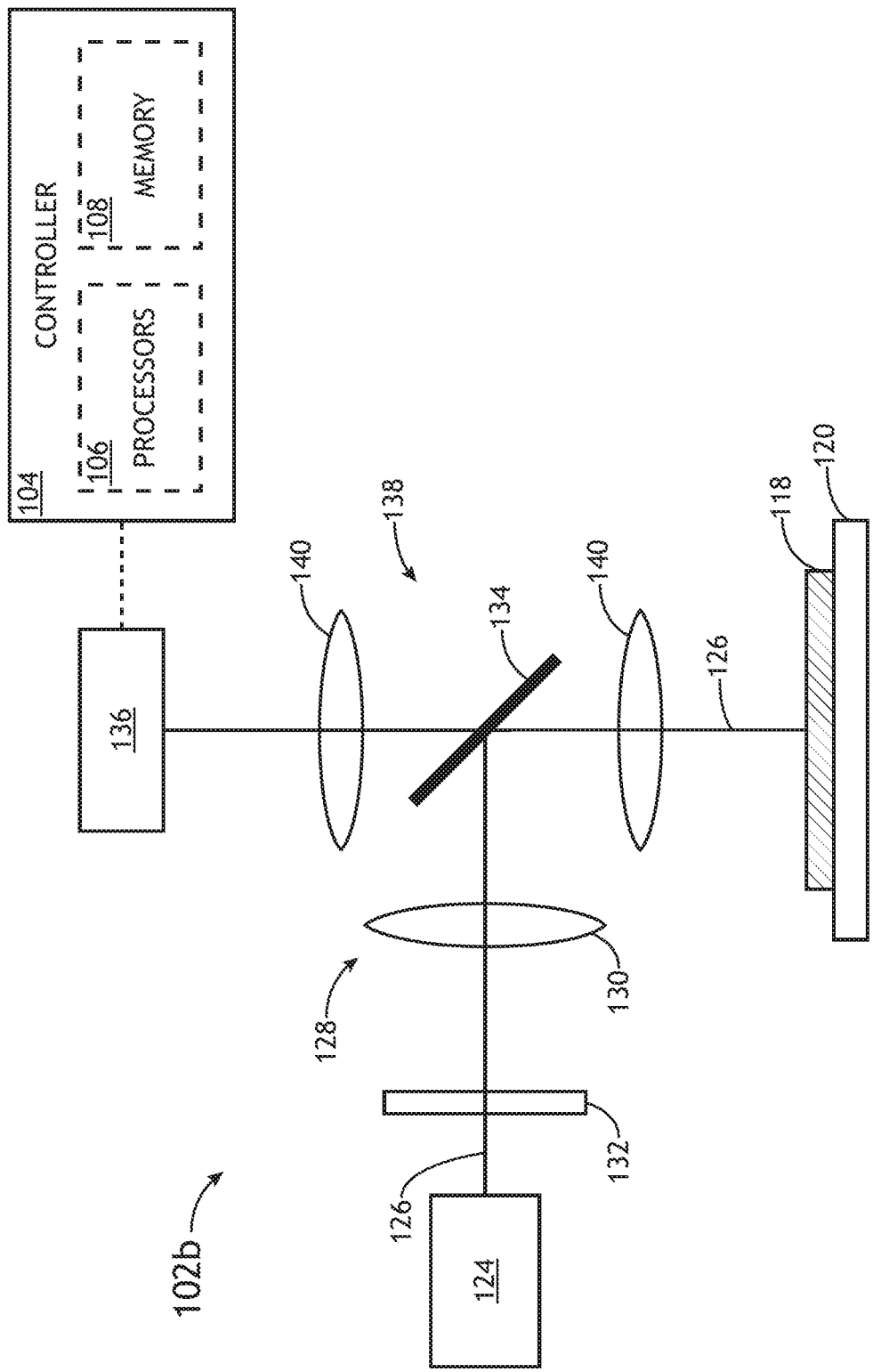
FIG. 1C is a conceptual view of a characterization tool, in accordance with one or more embodiments of the present disclosure.

Referring now to FIGS. 1B and 1C, various embodiments of a characterization tool 102 are described. For example, the characterization tool 102 may include, but is not required to include, a particle-based characterization tool 102a and/or an characterization tool 102b.

FIG. 1B is a conceptual view of a particle-based characterization tool 102a, in accordance with one or more embodiments of the present disclosure. The particle-based characterization tool 102a may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool.

In one embodiment, the particle-based characterization tool 102a includes a particle source 110 (e.g., an electron beam source, an ion beam source, or the like) to generate a particle beam 112 (e.g., an electron beam, a particle beam, or the like). The particle source 110 may include any particle source known in the art suitable for generating a particle beam 112. For example, the particle source 110 may include, but is not limited to, an electron gun or an ion gun. In another embodiment, the particle source 110 is configured to provide a particle beam with a tunable energy. For example, particle source 110 including an electron source may, but is not limited to, provide an accelerating voltage in the range of 0.1 kV to 30 kV. As another example, a particle source 110 including an ion source may, but is not required to, provide an ion beam with an energy in the range of 1 to 50 keV.

In another embodiment, the particle-based characterization tool 102a includes one or more particle focusing elements 114. For example, the one or more particle focusing elements 114 may include, but are not limited to, a single particle focusing element or one or more particle focusing elements forming a compound system. In another embodiment, the one or more particle focusing elements 114 include a particle objective lens 116 configured to direct the particle beam 112 to a sample 118 located on a sample stage 120. Further, the one or more particle source 110 may include any type of electron lenses known in the art including, but not limited to, electrostatic, magnetic, uni-potential, or double-potential lenses.

In another embodiment, the particle-based characterization tool 102a includes at least one particle detector 122 to image or otherwise detect particles emanating from the sample 118. In one embodiment, the particle detector 122 includes an electron collector (e.g., a secondary electron collector, a backscattered electron detector, or the like). In another embodiment, the particle detector 122 includes a photon detector (e.g., a photodetector, an x-ray detector, a scintillating element coupled to photomultiplier tube (PMT) detector, or the like) for detecting electrons and/or photons from the sample surface.

It is to be understood that the description of a particle-based characterization tool 102a as depicted in FIG. 1B and the associated descriptions above are provided solely for illustrative purposes and should not be interpreted as limiting. For example, the particle-based characterization tool 102a may include a multi-beam and/or a multi-column system suitable for simultaneously interrogating a sample 118. In a further embodiment, the particle-based characterization tool 102a may include one or more components (e.g., one or more electrodes) configured to apply one or more voltages to one or more locations of the sample 118. In this regard, the particle-based characterization tool 102a may generate voltage contrast imaging data.

It is recognized herein that the penetration depth of the particle beam 112 in the sample 118 may depend on the particle energy such that higher-energy beams typically penetrate deeper into the sample. In one embodiment, the particle-based characterization tool 102a utilizes different particle energies to interrogate different layers of the device based on the penetration depth of the particle beam 112 into the sample 118. For example, the particle-based characterization tool 102a may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

FIG. 1C is a conceptual view of an optical characterization tool 102b, in accordance with one or more embodiments of the present disclosure. The optical characterization tool 102*b* may include any type of optical metrology tool known in the art suitable for generating metrology data of a sample, including, without limitation, an optical metrology tool configured to generate and/or detect an optical illumination beam having x-ray, ultraviolet (UV), infrared (IR), or visible light wavelengths.

In one embodiment, the optical characterization tool 102*b* includes an optical illumination source 124 to generate an optical illumination beam 126. The optical illumination beam 126 may include one or more selected wavelengths of radiation including, but not limited to, x-ray, ultraviolet (UV) light, visible light, or infrared (IR) light.

The optical illumination source 124 may be any type of illumination source known in the art suitable for generating an optical illumination beam 126.

The optical illumination source 124 may include any type of illumination source suitable for providing an optical illumination beam 126. In one embodiment, the optical illumination source 124 is a laser source. For example, the optical illumination source 124 may include, but is not limited to, one or more narrowband laser sources, a broadband laser source, a supercontinuum laser source, a white light laser source, or the like. In this regard, the optical illumination source 124 may provide an optical illumination beam 126 having high coherence (e.g., high spatial coherence and/or temporal coherence). In another embodiment, the optical illumination source 124 includes a laser-sustained plasma (LSP) source. For example, the optical illumination source 124 may include, but is not limited to, a LSP lamp, a LSP bulb, or a LSP chamber suitable for containing one or more elements that, when excited by a laser source into a plasma state, may emit broadband illumination. In another embodiment, the optical illumination source 124 includes a lamp source. For example, the optical illumination source 124 may include, but is not limited to, an arc lamp, a discharge lamp, an electrode-less lamp, or the like. In this regard, the optical illumination source 124 may provide an optical illumination beam 126 having low coherence (e.g., low spatial coherence and/or temporal coherence).

In another embodiment, the optical illumination source 124 directs the optical illumination beam 126 to a sample 118 via an illumination pathway 128. The illumination pathway 128 may include one or more illumination pathway lenses 130 or additional optical components 132 suitable for modifying and/or conditioning the optical illumination beam 126. For example, the one or more optical components 132 may include, but are not limited to, one or more polarizers, one or more filters, one or more beam splitters, one or more diffusers, one or more homogenizers, one or more apodizers, or one or more beam shapers. The illumination pathway 128 may further include an objective lens 134 configured to direct the optical illumination beam 126 to the sample 118.

In another embodiment, the sample 118 is disposed on a sample stage 120. The sample stage 120 may include any device suitable for positioning and/or scanning the sample 118 within the optical characterization tool 102*b*. For example, the sample stage 120 may include any combination of linear translation stages, rotational stages, tip/tilt stages, or the like.

In another embodiment, the optical characterization tool 102*b* includes a detector 136 configured to capture light emanating from the sample 118 through a collection pathway 138. The collection pathway 138 may include, but is not limited to, one or more collection pathway lenses 140 for collecting light from the sample 118. For example, a detector 136 may receive light reflected or scattered (e.g., via specular reflection, diffuse reflection, and the like) from the sample 118 via one or more collection pathway lenses 140. By way of another example, a detector 136 may receive light generated by the sample 118 (e.g., luminescence associated with absorption of the optical illumination beam 126, or the like). By way of another example, a detector 136 may receive one or more diffracted orders of light from the sample 118 (e.g., 0-order diffraction, ±1 order diffraction, ±2 order diffraction, and the like).

The detector 136 may include any type of detector known in the art suitable for measuring illumination received from the sample 118. For example, a detector 136 may include, but is not limited to, a CCD detector, a TDI detector, a photomultiplier tube (PMT), an avalanche photodiode (APD), a complementary metal-oxide-semiconductor (CMOS) sensor, or the like. In another embodiment, a detector 136 may include a spectroscopic detector suitable for identifying wavelengths of light emanating from the sample 118.

In one embodiment, the detector 136 is positioned approximately normal to the surface of the sample 118. In another embodiment, the optical characterization tool 102*b* includes a beamsplitter oriented such that the objective lens 134 may simultaneously direct the optical illumination beam 126 to the sample 118 and collect light emanating from the sample 118. Further, the illumination pathway 128 and the collection pathway 138 may share one or more additional elements (e.g., objective lens 134, apertures, filters, or the like).

The optical characterization tool 102*b* may measure overlay based on any technique known in the art such as, but not limited to, imaged-based techniques or scatterometry-based techniques. Further, the optical characterization tool 102*b* may measure overlay based on features on any layer of the sample 118 by having the optical illumination beam 126 propagate through a surface layer to interact with features on one or more previously fabricated layers.

In another embodiment, the characterization tool 102 includes an edge-placement metrology tool suitable for measurements of the pattern placement distances (or pattern placement errors) of various features on a sample layer. For example, the position of the sample stage 120 may be tightly monitored to provide accurate positioning results over a large field of view. Further, it is recognized herein that positioning accuracy based on monitoring actual positions of the sample stage 120, as opposed to positioning accuracy based solely on control of the sample stage 120 itself, may be limited only by the monitoring accuracy. In one instance, though not shown, the position of the sample stage 120 along one or more directions is monitored using an interferometer, which may provide, but is not required to provide, nanometer or sub-nanometer accuracy. Further, the characterization tool 102 including an edge-placement metrology tool may be based on any type of imaging technology such as, but not limited to, optical or particle-beam imaging. The measurement of the positions and dimensions of structures using edge-placement metrology is generally described in Intl Pub. No. WO 2018/004511 titled "APPARATUS AND METHOD FOR THE MEASUREMENT OF PATTERN PLACEMENT AND SIZE OF PATTERN AND COMPUTER PROGRAM THEREFOR" and published on Jan. 4, 2018, and U.S. Pat. No. 9,704,238 titled "METHOD FOR CORRECTING POSITION MEASUREMENTS FOR OPTICAL ERRORS AND METHOD FOR DETERMIN- ING MASK WRITER ERRORS" and issued on Jul. 11, 2017, both of which are incorporated by reference herein in their entirety.

Figure 2:
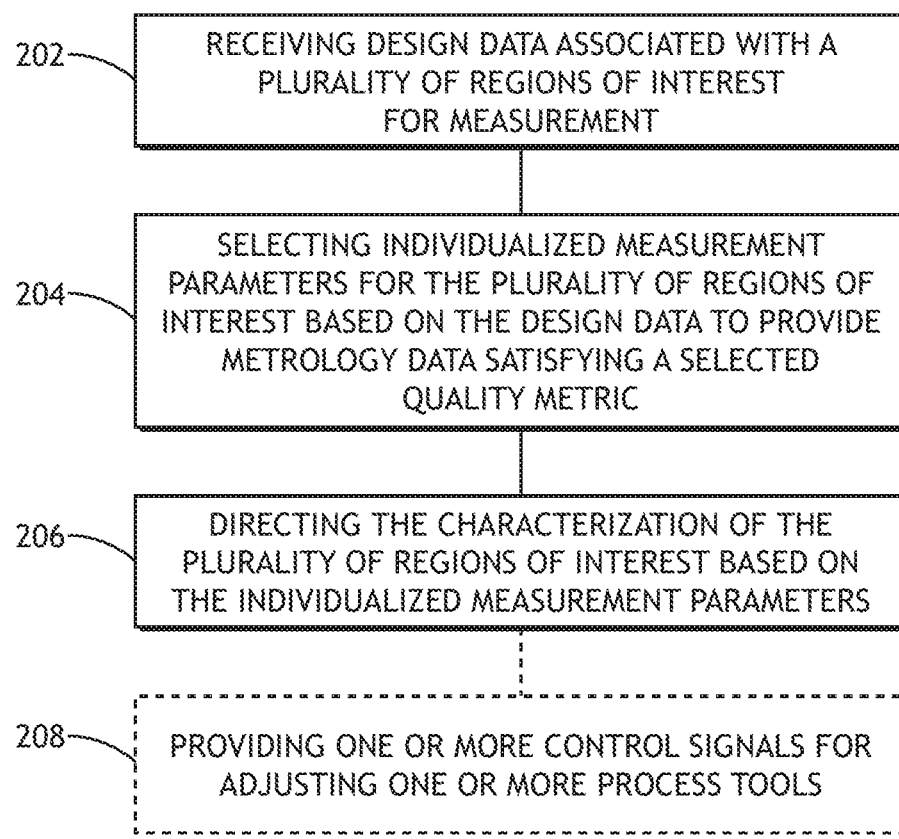
FIG. 2 is a flow diagram illustrating the steps performed in a method for metrology, in accordance with one or more embodiments of the present disclosure.

FIG. 2 is a flow diagram illustrating the steps performed in a method for metrology, in accordance with one or more embodiments of the present disclosure.

In step 202, design data associated with a plurality of regions of interest for measurement with a characterization tool is received. For example, the controller 104 may receive from the memory medium 108 or user input design data associated with a plurality of regions of interest for measurement with the characterization tool. Design data associated with a plurality of regions of interest for measurement with the characterization tool 102 may include data collected from a prior scan of the plurality of regions of interest. For example, data collected from a prior scan of the plurality of regions of interest may be stored in the memory medium 108 or may be provided via user input. Design data associated with a plurality of regions of interest may include a-priori knowledge of one or more portions of the sample stored in the memory medium 108 or provided by user input. For example, design data may include information related to the design of the plurality of regions of interest, such as a schematic or other design file. Design data associated with a plurality of regions of interest may include one or more modeled and/or simulated interactions of the illumination beam with one or more portions of the plurality of regions of interest. For example, design data may include a computer model of the expected interactions of the illumination beam with one or more portions of the plurality of regions of interest based on the properties, characteristics, and features of each of the illumination beam and the one or more portions of the plurality of regions of interest. Design data associated with a plurality of regions of interest may include one or more machine-learning based algorithms executed by the controller. For example, design data may include information developed by a machine learning analyzer using data collected during one or more prior, known measurements of a sample. By way of another example, the controller 104 may apply the machine learning analyzer to one or more signals indicative of metrology data.

In step 204, individualized measurement parameters for the plurality of regions of interest are selected based on the design data to provide metrology data satisfying a selected quality metric. For example, the one or more individualized measurement parameters may include a scan velocity of the illumination beam. By way of another example, the one or more individualized measurement parameters may include a scan trajectory (e.g., the angle of incidence relative to the sample, uniformity of illumination beam, shape of the illumination beam, path of the illumination beam, etc.) of the illumination beam. By way of another example, the one or more individualized measurement parameters may include a size or a number of averaged adjacent pixels associated with a datapoint of metrology data. By way of another example, the one or more individualized measurement parameters may include an integration time of one or more portions of a metrology system. By way of another example, the one or more individualized measurement parameters may include a shape of an illumination area of the illumination beam (e.g., rectangular, ovular, arbitrary, etc.). By way of another example, the one or more individualized measurement parameters may include an energy of the illumination beam (e.g., a wavelength or intensity). By way of another example, the one or more individualized measurement parameters may include the sensitivity of the detector or one or more other portions of the characterization tool. By way of another example, the one or more individualized measurement parameters may include deflection of the illumination beam (e.g., deflecting one or more portions of the illumination beam to avoid one or more portions of the sample that may be sensitive to the illumination beam). In this regard, the selected individualized measurement parameters for the plurality of regions of interest may be optimized for each of the plurality of regions of interest. For example, in the case of a particular region of interest such as an edge of one or more portions of the sample, the selected individualized measurement parameters may include a reduced scan velocity and/or an increased scan time and/or an increased intensity of the illumination beam with respect to such edge such that the metrology data generated from the sample is sufficient to satisfy one or more selected quality metrics. By way of another example, the selected individualized measurement parameters may include a modified scan trajectory of the illumination beam such that the illumination beam is configured to scan only one or more portions of the edges of one or more portions of the sample. It is noted that the embodiments of the present disclosure are not limited to one or more individualized measurement parameters of an edge of one or more portions of a sample, and may include any of the plurality of regions of interest, including, without limitation, edge portions, flat portions, areas of damage, areas sensitive to certain types of illumination, and the like, and the individualized measurement parameters may be selected, alone or in any combination, by the controller 104, based on the design data related to the particular region of interest.

The one or more selected quality metrics may include any metric indicative of the quality and/or accuracy of the metrology data generated. For example, the one or more selected quality metrics may include a signal strength of the metrology data. By way of another example, the one or more selected quality metrics may include a signal-to-noise ratio of the metrology data. By way of another example, the one or more selected quality metrics may include a contrast of an image of the sample generated by the characterization tool (e.g., a contrast of one or more regions of interest of the sample relative to one or more other portions of the sample, etc.). By way of another example, the one or more selected quality metrics may include a contrast to noise ratio of an image of the sample generated by the characterization tool.

In step 206, the characterization of the plurality of regions of interest based on the individualized measurement parameters is directed. For example, the controller 104 may direct the characterization tool 102 to generate metrology data for the plurality of regions of interest of the sample based on the individualized measurement parameters. Step 206 may include providing one or more control signals (or corrections to the control signals) for adjusting one or more individualized measurement parameters. For example, the controller 104 may provide one or more control signals to one or more portions of the characterization tool 102 for adjusting the one or more portions of the characterization tool 102 such that one or more individualized measurement parameters are adjusted. The one or more control signals (or corrections to the control signals) for adjusting one or more individualized measurement parameters may be provided by the controller 104 as part of a feedback and/or feedforward control loop. The controller 104 may cause the metrology system 100 to execute one or more adjustments to the one or more individualized measurement parameters based on the one or more control signals for adjusting one or more individualized measurement parameters, or the controller 104 may alert a user to make the one or more adjustments to the one or more individualized measurement parameters. In this sense, the one or more control signals for adjusting one or more individualized measurement parameters may compensate for measurement errors of one or more metrological processes of the metrology system 100, and thus may enable the controller 104 to maintain measurement within selected tolerances across multiple exposures on subsequent samples in the same or different lots.

By way of another example, the controller 104 may provide one or more control signals to one or more portions of the characterization tool 102 for adjusting the one or more portions of the characterization tool 102 such that one or more individualized measurement parameters are modified for only one portion of a particular region of interest or for only a period of time specified for the controller 104. As an illustration of the foregoing example, the controller 104 may provide one or more control signals to the optical illumination source 124 and/or the one or more optical components 132 of the characterization tool 102 such that the scan velocity and/or the scan trajectory of the illumination beam 126 are adjusted for a particular portion of the region of interest of the sample or for only a period of time specified by the controller 104. It is noted that the embodiments of the present disclosure are not limited to providing one or more control signals to the optical illumination source 124, the one or more optical components 132, and/or the stage 120 of the characterization tool 102, and that one or more control signals for adjusting one or more individualized measurement parameters may be provided by the controller 104 to any portion of the metrology system 100.

In step 208, one or more control signals for adjusting one or more process tools are provided. For example, the controller 104 may provide one or more control signals (or corrections to the control signals) to one or more portions of one or more process tools (e.g., lithographic tools) for adjusting the one or more parameters (e.g., fabrication settings, configuration, and the like) of the one or more process tools such that one or more parameters of the one or more process tools are adjusted. The control signals (or corrections to the control signals) may be provided by the controller 104 as part of a feedback and/or feedforward control loop. The controller 104 may cause the one or more process tools to execute one or more adjustments to the one or more parameters of the process tools based on the control signals, or the controller 104 may alert a user to make the one or more adjustments to the one or more parameters. In this sense, the one or more control signals may compensate for errors of one or more fabrication processes of the one or more process tools, and thus may enable the one or more process tools to maintain overlay within selected tolerances across multiple exposures on subsequent samples in the same or different lots.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
a controller communicatively coupled to a characterization tool, wherein the characterization tool is configured to generate metrology data for a sample based on interaction of an illumination beam with the sample, wherein the characterization tool includes one or more adjustable measurement parameters to control the generation of metrology data, the controller including one or more processors configured to execute program instructions causing the one or more processors to:
receive design data associated with a plurality of regions of interest for measurement with the characterization tool;
select individualized measurement parameters of the characterization tool for the plurality of regions of interest based on the design data to provide metrology data from a detector satisfying a selected quality metric, wherein the selected quality metric comprises at least one of signal strength, signal-to-noise ratio, contrast, or contrast-to-noise ratio; and
direct the characterization tool to characterize the plurality of regions of interest based on the individualized measurement parameters.

2. The system of claim 1, wherein the characterization tool comprises:
an illumination source configured to generate the illumination beam;
one or more illumination optics to direct the illumination beam to the sample; and
a detector to generate the metrology data for the sample based on the interaction of the illumination beam with the sample.

3. The system of claim 1, wherein the characterization tool scans the illumination beam across the sample to generate the metrology data.

4. The system of claim 3, wherein the individualized measurement parameters include a scan velocity, wherein the scan velocity for the edges is selected to be relatively slower than for uniform regions.

5. The system of claim 3, wherein the individualized measurement parameters include a scan velocity, wherein the scan velocity for the edges is selected to be relatively faster than for uniform regions.

6. The system of claim 3, wherein the individualized measurement parameters include a number of averaged adjacent pixels associated with a datapoint of the metrology data, wherein the number of averaged adjacent pixels for the edges is selected to be relatively lower than for uniform regions.

7. The system of claim 3, wherein the individualized measurement parameters include a number of averaged adjacent pixels associated with a datapoint of the metrology data, wherein the number of averaged adjacent pixels for the edges is selected to be relatively higher than for uniform regions.

8. The system of claim 3, wherein the individualized measurement parameters include an integration time of a detector, wherein the integration time for the edges is selected to be relatively longer than for uniform regions.

9. The system of claim 3, wherein the individualized measurement parameters include an integration time of a detector, wherein the integration time for the edges is selected to be relatively shorter than for uniform regions.

10. The system of claim 3, wherein the individualized measurement parameters include a scan trajectory, wherein the scan trajectory includes the edges and avoids at least some uniform regions.

11. The system of claim 3, wherein the individualized measurement parameters include a scan trajectory, wherein the scan trajectory includes at least some uniform regions and avoids the edges.

12. The system of claim 3, wherein the individualized measurement parameters include a shape of a measured area in a particular region of interest, wherein the shape includes the edges and avoids at least some uniform regions.

13. The system of claim 3, wherein the individualized measurement parameters include an energy of the illumination beam, wherein the energy of the illumination beam for the edges is selected to be relatively higher than for uniform regions.

14. The system of claim 13, wherein the energy of the illumination beam corresponds to at least one of a wavelength of the illumination beam or an intensity of the illumination beam.

15. The system of claim 13, wherein the illumination beam is a particle beam, wherein the energy of the illumination beam corresponds to at least one of a particle energy or a current density.

16. The system of claim 1, wherein the system is configured to characterize multiple regions of interest having common individualized measurement parameters.

17. The system of claim 1, wherein the individualized measurement parameters include a number of averaged adjacent pixels associated with a datapoint of the metrology data, wherein the number of averaged adjacent pixels for the edges is selected to be relatively lower than for uniform regions.

18. The system of claim 1, wherein the individualized measurement parameters include an integration time of the detector, wherein the integration time for the edges is selected based on at least one of a number or density of the edges.

19. The system of claim 1, wherein selecting individualized measurement parameters of the characterization tool for the plurality of regions of interest based on the design data to provide metrology data from the detector satisfying a selected quality metric comprises:
    selecting individualized measurement parameters of the characterization tool based on a-priori knowledge of structures in the plurality of regions of interest.

20. The system of claim 1, wherein selecting individualized measurement parameters of the characterization tool for the plurality of regions of interest based on the design data to provide metrology data from the detector satisfying a selected quality metric comprises:
    selecting individualized measurement parameters of the characterization tool based on a modeled interaction of the illumination beam with structures in the plurality of regions of interest.

21. The system of claim 1, wherein selecting individualized measurement parameters of the characterization tool for the plurality of regions of interest based on the design data to provide metrology data from the detector satisfying a selected quality metric comprises:
    selecting individualized measurement parameters of the characterization tool based on simulated interactions of the illumination beam with structures in the plurality of regions of interest from one or more test samples.

22. A system comprising:
a characterization tool comprising:
an illumination source configured to generate an illumination beam;
one or more illumination optics to direct the illumination beam to a sample; and
a detector to generate metrology data for the sample based on interaction of the illumination beam with the sample, wherein the characterization tool includes one or more adjustable measurement parameters to control the generation of metrology data; and
a controller communicatively coupled to the characterization tool, the controller including one or more processors configured to execute program instructions causing the one or more processors to:
receive design data associated with a plurality of regions of interest for measurement with the characterization tool;
select individualized measurement parameters of the characterization tool for the plurality of regions of interest based on the design data to provide metrology data from the detector satisfying a selected quality metric, wherein the selected quality metric comprises at least one of signal strength, signal-to-noise ratio, contrast, or contrast-to-noise ratio; and
direct the characterization tool to characterize the plurality of regions of interest based on the individualized measurement parameters.

23. A method comprising:
receiving design data associated with a plurality of regions of interest for measurement with a characterization tool configured to generate metrology data for a sample based on interaction of an illumination beam with the sample, wherein the characterization tool includes one or more adjustable measurement parameters to control the generation of metrology data;
selecting individualized measurement parameters of the characterization tool for the plurality of regions of interest based on the design data to provide metrology data from a detector satisfying a selected quality metric, wherein the selected quality metric comprises at least one of signal strength, signal-to-noise ratio, contrast, or contrast-to-noise ratio; and
directing the characterization tool to characterize the plurality of regions of interest based on the individualized measurement parameters.

24. The system of claim 1, wherein the design data of a particular region of interest of the plurality of regions of interest includes one or more locations of one or more edges in the particular region of interest.

* * * * *